United States Patent

Houdebine et al.

(10) Patent No.: US 10,823,771 B2
(45) Date of Patent: Nov. 3, 2020

(54) METHOD AND DEVICE FOR MEASURING THE FREQUENCY OF A SIGNAL

(71) Applicant: STMicroelectronics SA, Montrouge (FR)

(72) Inventors: Marc Houdebine, Crolles (FR); Sebastien Dedieu, La Terrasse (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 16/280,190

(22) Filed: Feb. 20, 2019

(65) Prior Publication Data
US 2019/0178922 A1 Jun. 13, 2019

Related U.S. Application Data

(63) Continuation of application No. 15/139,801, filed on Apr. 27, 2016, now Pat. No. 10,261,117.

(30) Foreign Application Priority Data

Nov. 19, 2015 (FR) ...................................... 15 61153

(51) Int. Cl.
G01R 23/10 (2006.01)
G01R 23/02 (2006.01)
H03D 13/00 (2006.01)

(52) U.S. Cl.
CPC ............. G01R 23/10 (2013.01); G01R 23/02 (2013.01); H03D 13/001 (2013.01)

(58) Field of Classification Search
None
See application file for complete search history.

(56) References Cited

U.S. PATENT DOCUMENTS 4,786,861 A 11/1988 Hulsing, II et al.
5,321,350 A * 6/1994 Haas ...................... G01R 23/02
324/76.11

(Continued)

FOREIGN PATENT DOCUMENTS

CN 203313155 U 11/2013
DE 102010046880 A1 3/2012

(Continued)

OTHER PUBLICATIONS

Huang, D. et al., :A Time-to-Digital Converter Based AFC for Wideband Frequency Synthesizer, 2012 IEEE Internationla Symposium on Circuits and Systems, May 20-23, 2012, pp. 1299-1302, Seoul, Korea (South).

(Continued)

Primary Examiner — Steven M Christopher
(74) Attorney, Agent, or Firm — Slater Matsil, LLP

(57) ABSTRACT

A method includes a) counting whole periods of a signal during a first period of a reference signal, b) repeating step a) for each period of the reference signal until a first duration is equal to a first quantity of periods of the reference signal, and c) determining a first average of the whole periods. The method also includes repeating at least one of steps a) to c) and at each repetition shifting a start of the counting of step a) by at least one period of the reference signal, and in steps b) and c) accounting for whole periods of the signal already counted during the at least one preceding group of steps a) and b). The method includes determining a second average of the first averages, and determining the frequency of the signal from the second average and the frequency of the reference signal.

20 Claims, 3 Drawing Sheets

(56) References Cited

U.S. PATENT DOCUMENTS

| | | |
|---|---|---|
| 5,617,574 A | 4/1997 | Boutaud et al. |
| 7,902,891 B1 | 3/2011 | Miyanaga et al. |
| 2010/0188158 A1 | 7/2010 | Ainspan et al. |
| 2011/0082656 A1 | 4/2011 | Todorokihara |
| 2011/0127739 A1 | 6/2011 | Chen et al. |
| 2012/0030269 A1 | 2/2012 | Rubio et al. |
| 2012/0290136 A1* | 11/2012 | Romanowich ...... F24F 13/1426 700/276 |

FOREIGN PATENT DOCUMENTS

| | | |
|---|---|---|
| EP | 0762628 A1 | 3/1997 |
| EP | 1538451 A1 | 8/2005 |
| EP | 1835621 A1 | 9/2007 |
| FR | 2905040 A1 | 2/2008 |

OTHER PUBLICATIONS

Liobe, J. et al., "A Novel Application of FM-ADC Toward the Self-Calibration of Phase-Locked Loops", IEEE Transactions on Circuits and Systems I: Regular Papers, vol. 55, No. 9, Oct. 2008, 14 pages.

* cited by examiner

METHOD AND DEVICE FOR MEASURING THE FREQUENCY OF A SIGNAL

CROSS-REFERENCE TO RELATED APPLICATIONS

This application is a continuation of U.S. patent application Ser. No. 15/139,801, filed on Apr. 27, 2016, which claims priority to French Application No. 1561153, filed Nov. 19, 2015, both applications are hereby incorporated herein by reference.

TECHNICAL FIELD

Implementations and embodiments of the invention relate to periodic signal frequency measurements.

BACKGROUND

The invention applies, for example, but not restrictively to calibrating the gain of a voltage-controlled oscillator (VCO) in phase-locked loops (PLL).

A phase-locked loop is a looped system capable of delivering a signal where the frequency is slaved to that of a reference signal.

More precisely and conventionally, a phase-locked loop notably includes a phase comparator receiving on one input a reference signal, and a voltage-controlled oscillator where the control input is coupled to the output of the phase comparator and where the output, looped back onto another input of the phase comparator after a frequency division, delivers an output signal slaved in frequency and phase to that of the reference signal but generally having a higher frequency than that of the reference signal.

During a calibration in gain of the voltage-controlled oscillator, the frequency of the oscillator output signal is determined for two different values of the input voltage (generally obtained from two different digital words respectively representative of the two different voltages), and the ratio is obtained between the difference of these two output frequencies and the difference of the two digital words.

Methods are known for calculating a frequency of a signal from the frequency of a reference signal, notably using an average of the numbers of periods of the first signal counted during a given number of periods of the reference signal. However, the more accurate the measurements have to be, the more time-consuming these methods are.

By way of example, for a measurement accuracy of 62.5 kHz, the accurate determination of the frequency of a signal which is, for example, around 2.4 GHz, from a reference signal having a frequency of 16 MHz requires 256 periods of the reference signal, or 16 microseconds.

This leads to a substantial duration of the gain calibration phase.

However, some low consumption communication applications, such as Bluetooth low energy (BLE), require a faster start of the phase-locked loop, and therefore in particular a short duration of the gain calibration phase of the oscillator notably in order to save battery power.

Thus, according to one implementation and embodiment provision is made for a simple and fast determination of a frequency of a signal from a reference signal.

SUMMARY

According to one aspect a method is provided for determining the frequency of a signal from a periodic reference signal, including a) a count of the number of whole periods of the signal during a first period of the reference signal (the first period of the reference signal is, for example, the period beginning after a starting instant for determining the frequency of the signal), b) a repetition of step a) for each period of the reference signal until the expiry of a first duration equal to a first quantity of periods of the reference signal, c) a determination of a first average of the numbers, d) R repetitions of at least one part of steps a) to c), at each repetition shifting the start of counting of step a) by at least one period of the reference signal, and optionally taking into account for step b) and step c) the numbers of whole periods of the signal already counted during the at least one preceding group of steps a) and b).

Indeed in step d), it would be possible at each repetition of step b) to recount numbers already counted during a preceding repetition. However, as will be seen later, it is possible to keep the number already counted in preceding repetitions and in a current repetition only to count the number of whole periods of the signal during the new current period of the reference signal, and of course to use this new number and the numbers already counted to effect the first average.

The method according to this aspect also comprises:

e) a determination of a second average of all the first averages thus obtained, and f) a determination of the frequency of the signal from the second average and the frequency of the reference signal.

Thus, it is possible through the use of these R sliding averages to determine the frequency of the signal with a high accuracy without this causing any significant increase in the duration of the frequency determination.

Advantageously, steps a), b) and c) may be performed in parallel.

Steps a) to e) may be implemented by applying the following formula:

$$M2 = \frac{1}{R} * \left( \sum_{k=1}^{R} \frac{1}{S} \sum_{i=k}^{k+S-1} C_i \right)$$

in which M2 designates the second average, S corresponds to the first quantity and $C_i$ corresponds to the number of whole periods counted during a current period of the periodic reference signal.

This general formula can be used to determine the second average, e.g., via software.

However, when R is equal to a second quantity P of periods of the reference signal reduced by the first quantity S, and the first quantity S and the second quantity P are powers of two, the formula may be expressed even more advantageously and allowing for a relatively simple hardware implementation.

Thus, when the first quantity S is equal to half the second quantity P, steps a) to e) may be implemented by applying the following formula:

$$M2 = \frac{1}{P-S} * \frac{1}{S} * \left( \sum_{i=1}^{S} i * C_i + \sum_{i=S+1}^{P-1} (P-i) * C_i \right)$$

This formula advantageously allows a relatively simple hardware implementation of the method, based on, for example, a counter, a setpoint counter, an accumulator, etc.

When the first quantity S is less than $$\frac{P}{2},$$

steps a) to e) may be implemented by applying the following formula:

$$M2 = \frac{1}{P-S} * \frac{1}{S} * \left( \sum_{i=1}^{S} i * C_i + \sum_{i=S+1}^{P-S} S * C_i + \sum_{i=P-S+1}^{P-1} (P-i) * C_i \right)$$

This formula also allows a relatively simple hardware implementation of the method, based on, for example, a counter, a setpoint counter slightly different from the preceding setpoint counter, an accumulator, etc.

According to another aspect, a device is provided for determining the frequency of a signal from a periodic reference signal, including a processor configured to perform a) a count of the number of whole periods of the signal during a first period of the reference signal,
b) repeat step a) for each other period of the reference signal during a first duration equal to a first quantity of periods of the reference signal,
c) determine a first average of the numbers,
d) R repetitions of at least one part of steps a) to c), at each repetition shifting the start of counting of step a) by at least one period of the reference signal, and optionally taking into account for step b) and step c) the numbers of whole periods of the signal already counted during the at least one preceding group of steps a) and b).
e) a determination of a second average of all the first averages thus obtained, and
f) a determination of the frequency of the signal from the second average and the frequency of the reference signal.

The processor may be advantageously configured to perform the R repetitions d) of steps a), b) and c) in parallel.

According to one embodiment, the processor is configured for implementing steps a) to e) by applying the following formula:

$$M2 = \frac{1}{R} * \left( \sum_{k=1}^{R} \frac{1}{S} \sum_{i=k}^{k+S-1} C_i \right)$$

in which M2 designates the second average, S corresponds to the first quantity and Ci corresponds to the number of whole periods of the signal counted during a current period of the periodic reference signal.

When the first quantity S is equal to half the second quantity P, the processor is configured to implement steps a) to e) by applying the following formula:

$$M2 = \frac{1}{P-S} * \frac{1}{S} * \left( \sum_{i=1}^{S} i * C_i + \sum_{i=S+1}^{P-1} (P-i) * C_i \right)$$

The processor may then include
a counter configured for delivering the successive numbers,
a setpoint counter configured, during the P−1 reference periods of the reference signal, for being incremented by one at each new reference period up to the first quantity then being decremented by one at each new reference period,
a multiplier having two inputs connected respectively to the outputs of the counting means and the setpoint counter,
an accumulator coupled at the output of the multiplier, and
a shifter configured to perform a bit shift corresponding to the division by the product of the first quantity by the difference between the second quantity and the first quantity. This shifter may be implemented, for example, by a software module.

When the first quantity is less than half the second quantity, the processor is configured for implementing steps a) to e) by applying the following formula:

$$M2 = \frac{1}{P-S} * \frac{1}{S} * \left( \sum_{i=1}^{S} i * C_i + \sum_{i=S+1}^{P-S} S * C_i + \sum_{i=P-S+1}^{P-1} (P-i) * C_i \right)$$

Thus, the processor may include:
a counter configured for delivering the successive numbers,
a setpoint counter configured, during the P−1 reference periods of the reference signal, for being incremented by one at each new reference period up to the first quantity, then being kept at the first quantity during a number of reference periods equal to the difference between P−1 and 2S, then being decremented by one at each new reference period,
a multiplier having two inputs connected respectively to the outputs of the counting means and the setpoint counter,
an accumulator coupled at the output of the multiplier, and
a shifter configured for performing a bit shift corresponding to the division by the product of the first quantity by the difference between the second quantity and the first quantity. This shifter may also be implemented, for example, by a software module.

BRIEF DESCRIPTION OF THE DRAWINGS

Other advantages and features of the invention will appear on examination of the detailed description of implementations and embodiments of the invention, in no way restrictive, and the attached drawings in which.

DETAILED DESCRIPTION OF ILLUSTRATIVE EMBODIMENTS

Figure 1:
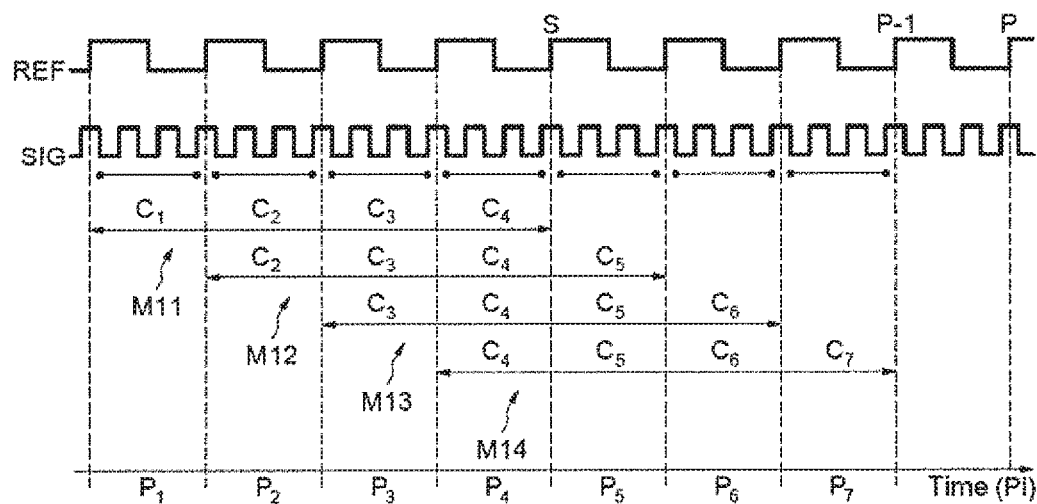
FIG. 1 is a graph of a frequency of a signal SIG and a periodic reference signal REF in accordance with the invention.

FIG. 1 illustrates an example of a method for determining a frequency of a periodic signal SIG, from a periodic reference signal REF.

The reference signal REF may be, for example, but not restrictively a reference signal of a phase-locked loop, and the signal SIG may be, for example, but not restrictively the signal delivered by a voltage-controlled oscillator forming part of this same phase-locked loop.

In the rest of the description, the index i will be used to represent the various elements associated with a period Pi of the reference signal. Thus, an index 1 is associated with the period P1, an index 2 with the period P2, etc.

In a first step a) of the method a count is performed of a number Ci of whole periods of the first signal SIG during a first reference period P1 of the reference signal REF.

The count a) is repeated (step b)) for each other successive period Pi of the reference signal REF, during a first quantity S of reference periods Pi.

In this example S=4. Thus successive counts are performed of the numbers C1, C2, C3 and C4 of whole periods of the first signal SIG taking place during the successive periods P1, P2, P3 and P4.

Then (step c)) a first average M11 is determined of the different numbers Ci counted during the four repetitions of the first step a). In this example, the first average M11 will be equal to the sum of the numbers C1, C2, C3 and C4, divided by the first quantity S=4.

Steps a) to c) are repeated a quantity of times equal to the difference between a second quantity P of reference periods and the first quantity S=4, by shifting the start of the counting of a reference period Pi at each repetition.

In this example P=8. Thus P−S=4 first averages M11, M12, M13 and M14 are determined in parallel each relating to 4 successive numbers Ci.

M11 is thus the average of the numbers C1 to C4, M12 the average of the numbers C2 to C5, M13 the average of the numbers C3 to C6, and M14 the average of the numbers C4 to C7.

Finally, a second average M2 is determined on the values of the first averages M11, M12, M13, and M14.

Here, the value of the second average M2 is thus equal to the sum of the first averages M11, M12, M13 and M14, divided by P−S=4.

In order to obtain the frequency of the first signal, the frequency of the reference signal is then multiplied by the value of the second average M2.

The method thus implemented is equivalent to applying the following first formula F1:

$$M2 = \frac{1}{P-S} * \left( \sum_{k=1}^{P-S} \frac{1}{S} \sum_{i=k}^{k+S-1} C_i \right) \quad \text{(F1)}$$

This formula could be implemented in a software form e.g. within a microcontroller.

However, the inventors have observed that by selecting the first quantity S and the second quantity P as powers of two and particularly by selecting $$S = \frac{P}{2},$$

the method is equivalent to applying the following second formula F2:

$$M2 = \frac{1}{P-S} * \frac{1}{S} * \left( \sum_{i=1}^{S} i*C_i + \sum_{i=S+1}^{P-1} (P-i)*C_i \right) \quad \text{(F2)}$$

Figure 2:
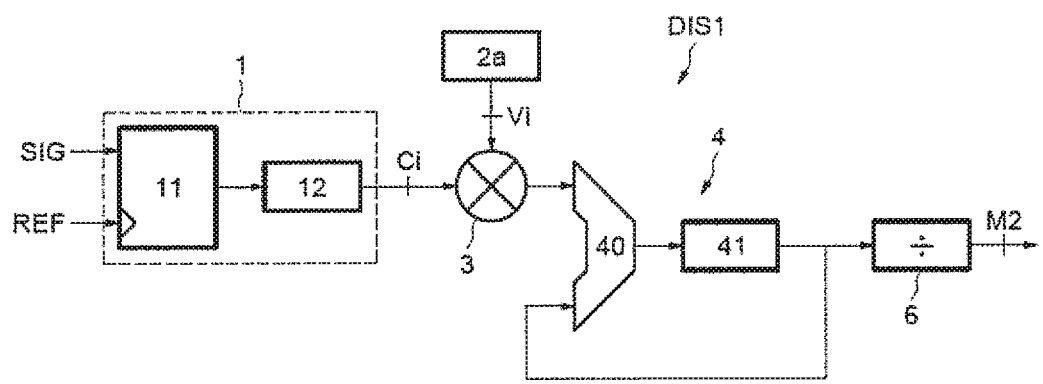
FIG. 2 is a schematic diagram of a device to determine the frequency of the signal of FIG. 1 from a periodic reference signal.

This formula is particularly advantageous since it can be used to apply the formula not only with software means, but also with simple hardware means such as those of the device DIS1 illustrated in FIG. 2.

It is then also possible not to repeat the counting of certain numbers Ci at each repetition and to keep these numbers Ci for subsequently weighting them.

The device DIS1 in FIG. 2 here includes a counting means 1, receiving as input the reference signal REF and the first signal SIG. The counting means 1 is configured for counting each number Ci of whole periods of the first signal SIG taking place during each reference period Pi.

In this example, the counting means 1 includes a counter 11 clocked by the signal REF associated with a decoder 12.

The counter 11 is configured for being incremented at each period of the signal SIG, and the decoder 12 is configured for resetting the counter 11 to zero at each reference period Pi.

The device DIS1 also includes a setpoint counter 2a configured for delivering a counter value Vi at each reference period Pi of the reference signal.

Figure 3:
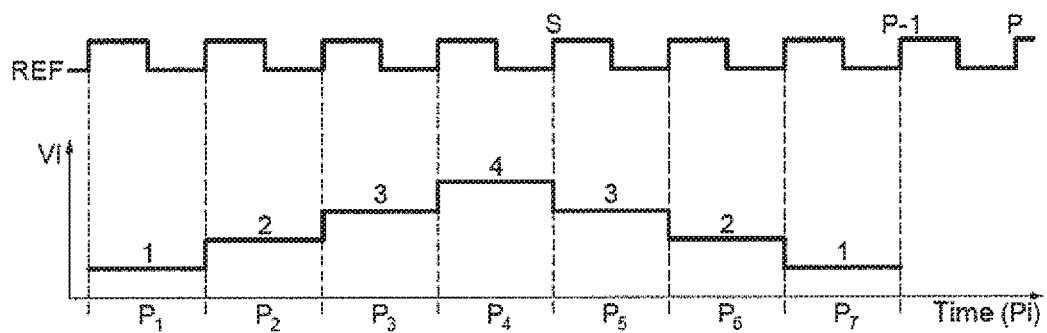
FIG. 3 is a graph of a setpoint counter of FIG. 2 being incremented and decremented in accordance with the invention.

As illustrated in FIG. 3, the counter 2a is in this example configured, during the P−1=7 reference periods P1 to P7, for being incremented by one at each new reference period Pi up to the first quantity S=4 then being decremented by one at each new reference period Pi.

Thus, the value Vi of the setpoint counter will be successively equal to 1, 2, 3, 4, 3, 2, 1 respectively during the reference periods P1, P2, P3, P4, P5, P6, P7.

The outputs of the counting means 1 and the setpoint counter 2a are both connected to a multiplier 3 (FIG. 2). Thus, each successive number Ci is multiplied by the associated counter value Vi.

An accumulator 4 comprises an asynchronous adder 40 and a register 41 for synchronizing the sums to be performed. A first input of the adder is connected at the output of the multiplier 3 so as to receive each number Ci multiplied by its associated counter value Vi. The output of the register 41 is looped back onto a second input of the adder. Initially, the accumulator 4 contains a zero value.

At each reference period Pi, the accumulator stores the output value of the multiplier and adds it together with the previously stored value. The sum of the stored values is returned on the second input of the adder 40 and synchronized by the register 41.

The sum finally stored is therefore equal to $$C_1+2*C_2+3*C_1+4*C_4+3*C_5+2*C_6+C_7$$

The device further includes a shifting means 6, e.g. a software module, configured for performing a bit shift on the binary value of the stored sum and delivering the second average M2.

In this example, the bit shift corresponds to a division by the product (P−S)*S=16, i.e. a 4-bit right shift.

It should be noted that the division thus performed by a bit shift is possible thanks to the selection of powers of 2 for the first quantity S and the second quantity P.

Thus it is possible, for a 16 MHZ reference signal, to obtain an accuracy of 62.5 kHz in a number of periods of the reference signal equal to 32, while 256 periods of the reference signal would have been required with a conventional counter.

Figure 4:
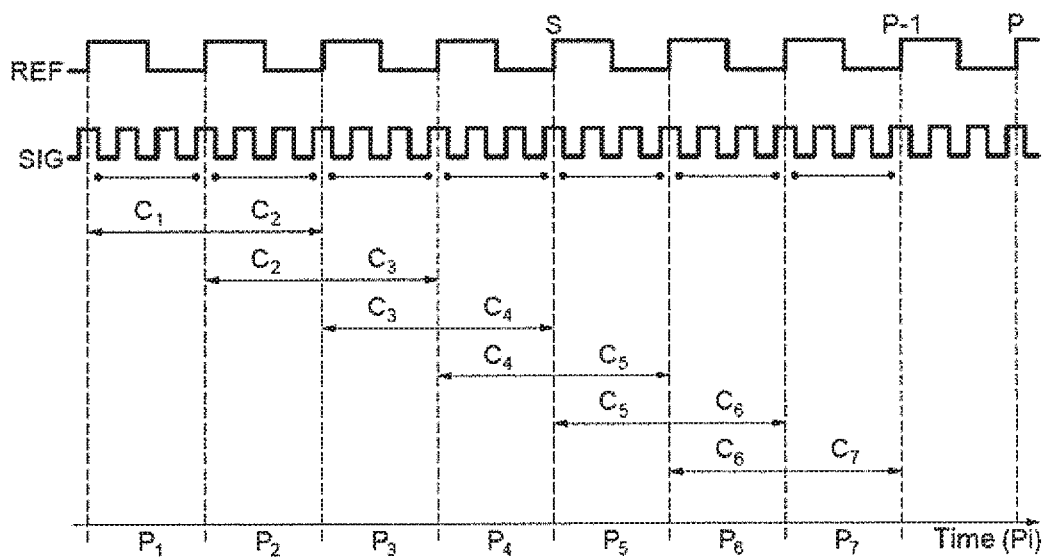
FIG. 4 is a graph of the frequency of the signal SIG and the periodic reference signal REF in accordance with an embodiment of the invention.
Figure 5:
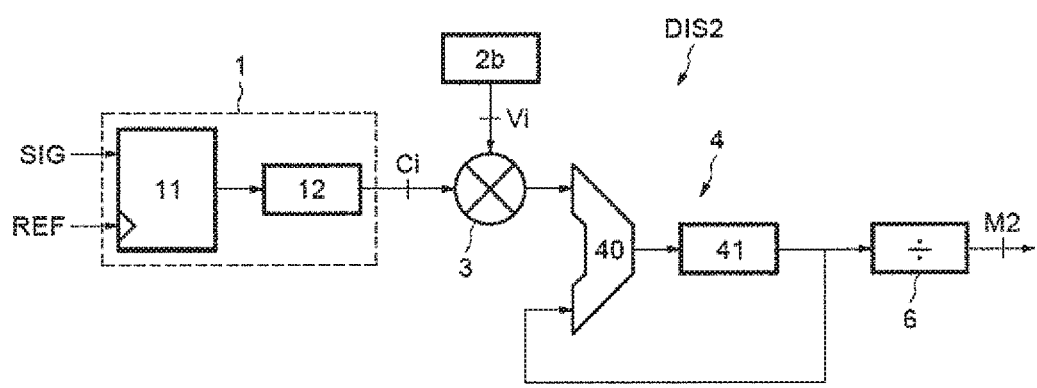
FIG. 5 is a schematic diagram of a device to determine the frequency of the signal of FIG. 4 from a periodic reference signal in accordance with an embodiment of the invention.
Figure 6:
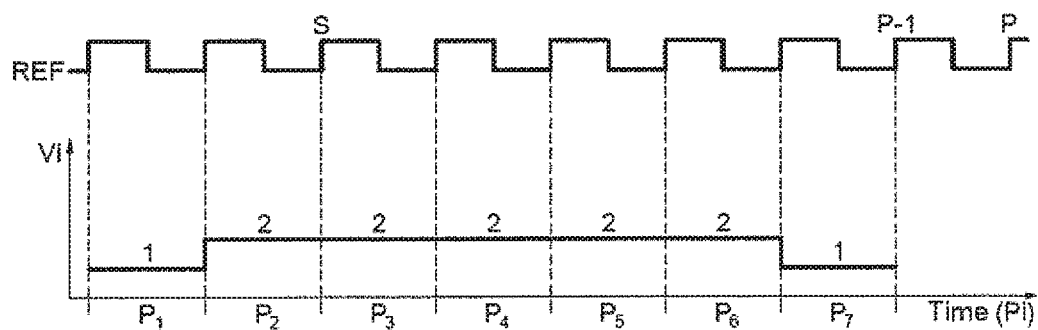
FIG. 6 illustrates a graph of the setpoint counter of FIG. 5 being incremented and decremented in accordance with an embodiment of the invention.

According to another implementation illustrated in FIGS. 4 to 6, S is selected less than $$\frac{P}{2},$$

e.g. S=2 and P=8.

Thus successive counts are performed of the numbers Ci of whole periods of the signal SIG taking place during two successive periods Pi.

Then the average M11 is determined of the two numbers C1 and C2 counted during the two reference periods P1 and P2.

This step of the method is repeated a quantity of times equal to P−S=6, by shifting the start of the counting of a reference period Pi at each repetition.

Thus 6 averages M11, M12, M13, M14, M15 and M16 are determined in parallel, each relating to 2 successive numbers Ci.

Finally, a second average M2 is determined on the values of the first averages M11, M12, M13, M14, M15 and M16.

The inventors have noticed that by selecting $$S < \frac{P}{2},$$

with P and S as powers of two, the above formula F1 is equivalent to the following formula F3:

$$M2 = \frac{1}{P-S} * \frac{1}{S} * \left( \sum_{i=1}^{S} i * C_i + \sum_{i=S+1}^{P-S} S * C_i + \sum_{i=P-S+1}^{P-1} (P-i) * C_i \right) \quad (F3)$$

This formula can be used to apply this method with software means, but also again with simple hardware means such as the device DIS2 illustrated in FIG. 5 while avoiding repetitive counts of certain numbers Ci.

This device DIS2 is similar to the device DIS1 illustrated in FIG. 2 and described previously, but differs in that it includes a setpoint counter 2b configured differently.

FIG. 6 illustrates a possible operation of the setpoint counter 2b in the case where P=8 and S=2.

Here the counter is configured for being incremented at the second reference period P2, then during five reference periods P2 to P6 for being kept at a value equal to two, and then for being decremented once during the reference period P7.

Thus, the sum finally stored by the accumulator is therefore $$C_1+2*C_2+2*C_1+2*C_4+2*C_5+2*C_6+C_7$$

In this embodiment also, the division again comprises a bit shift on the accumulator value, and this is possible thanks to the selection of powers of two for the first quantity S and the second quantity P.

Although implementations and embodiments of the invention have been described here in which the second quantity P is 8 and the first quantity S is 2 or 4, the invention is compatible with any other first quantity and any other second quantity, whether or not these two quantities are powers of two, so long as S is less than P. The fact that S and P are powers of two enables a particularly compact integrated embodiment to be obtained and the division by S (P−S) to be performed by a simple bit shift.

What is claimed is:

1. A method for determining a frequency of a signal using a frequency measurement circuit, the method comprising, using the frequency measurement circuit:
   a) counting a number of whole periods of the signal during a first period of a periodic reference signal;
   b) repeating step a) for each period of the periodic reference signal until a first duration is equal to a first quantity of periods of the periodic reference signal;
   c) determining a first average of the numbers of whole periods;
   d) repeating at least one of steps a), b) and c) and at each repetition shifting a start of the counting of step a) by at least one period of the periodic reference signal;
   e) determining a second average of the first averages; and
   f) determining the frequency of the signal from the second average and the frequency of the periodic reference signal by multiplying the second average times the frequency of the periodic reference signal.

2. The method of claim 1, wherein repeating at least one of steps a), b) and c) comprises repeating steps a), b) and c) in parallel.

3. The method of claim 1, wherein steps a) to e) are implemented by applying the following formula:

$$M2 = \frac{1}{R} * \left( \sum_{k=1}^{R} \frac{1}{S} \sum_{i=k}^{k+S-1} C_i \right)$$

wherein M2 designates the second average, S corresponds to the first quantity of periods, R corresponds to a number of repetitions of steps during step d), and $C_i$ corresponds to the number of whole periods of the signal counted during a current period of the periodic reference signal.

4. The method of claim 1, wherein the repetitions of steps a), b) and c) is equal to a second quantity of periods of the periodic reference signal reduced by the first quantity of periods.

5. The method of claim 4, wherein the first quantity and the second quantity of periods are powers of two.

6. The method of claim 5, wherein the first quantity of periods is equal to half the second quantity of periods.

7. The method of claim 6, wherein steps a) to e) are implemented by applying the following formula:

$$M2 = \frac{1}{P-S} * \frac{1}{S} * \left( \sum_{i=1}^{S} i * C_i + \sum_{i=S+1}^{P-1} (P-i) * C_i \right)$$

wherein M2 designates the second average, S corresponds to the first quantity of periods, P corresponds to the second quantity of periods and $C_i$ corresponds to the number of whole periods of the signal counted during a current period of the periodic reference signal.

8. The method of claim 5, wherein the first quantity of periods is less than half the second quantity of periods.

9. The method of claim 8, wherein steps a) to e) are implemented by applying the following formula:

$$M2 = \frac{1}{P-S} * \frac{1}{S} * \left( \sum_{i=1}^{S} i*C_i + \sum_{i=S+1}^{P-S} S*C_i + \sum_{i=P-S+1}^{P-1} (P-i)*C_i \right)$$

wherein M2 designates the second average, S corresponds to the first quantity of periods, P corresponds to the second quantity of periods and $C_i$ corresponds to the number of whole periods of the signal counted during a current period of the periodic reference signal.

10. The method of claim 1, wherein in steps b) and c) accounting for the numbers of whole periods of the signal already counted during the at least one preceding group of steps a) and b).

11. The method of claim 1, wherein determining the second average comprises performing a bit shift on an accumulator value.

12. The method of claim 1, wherein counting the number of whole periods comprises using a counter, the method further comprising, during step b), resetting the counter after each period of the periodic reference signal.

13. A method for determining a frequency of a signal using a frequency measurement circuit, the method comprising:
receiving the signal with a first input;
receiving a periodic reference signal with a second input;
counting, with a counter of the frequency measurement circuit, a number of whole periods of the signal to generate a period count during each period of the periodic reference signal for P −1 periods, wherein P is a positive integer;
resetting the counter after each period of the periodic reference signal;
incrementing by 1 a setpoint counter of the frequency measurement circuit after each period of the periodic reference signal until the setpoint counter reaches S, wherein S is a positive integer lower than P;
multiplying each period count with an output of the setpoint counter to generate respective counter values;
accumulating, with an accumulator of the frequency measurement circuit, the respective counter values; and
generating an average value by dividing the accumulated counter value by (P-S)*S, wherein the frequency of the signal is based on the average value.

14. The method of claim 13, further comprising decrementing by 1 the setpoint counter a period after the setpoint counter reaches S.

15. The method of claim 13, further comprising keeping the output of the setpoint counter at S for more than 1 period of the periodic reference signal.

16. The method of claim 13, wherein S and P are powers of 2.

17. The method of claim 13, wherein S is half of P.

18. The method of claim 13, further comprising dividing the accumulated counter value by (P-S)*S by performing a shift operation on a register of the accumulator.

19. The method of claim 13, wherein the first input is coupled to an output of a voltage controlled oscillator (VCO) of a phased-locked loop (PLL) and the second input is coupled to a reference input of the PLL.

20. The method of claim 1, further comprising:
receiving the signal from a voltage controlled oscillator (VCO) of a phased-locked loop (PLL); and
receiving the periodic reference signal from the PLL.

* * * * *